United States Patent
Convent et al.

(10) Patent No.: US 7,340,633 B2
(45) Date of Patent: Mar. 4, 2008

(54) METHOD FOR AUTOMATICALLY DETECTING THE CLOCK FREQUENCY OF A SYSTEM CLOCK PULSE FOR THE CONFIGURATION OF A PERIPHERAL DEVICE

(75) Inventors: Thomas Convent, Issum-Sevelen (DE); Markus Hammes, Dinslaken (DE); Roland Hellfajer, Bochum (DE); Michael Jung, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 91 days.

(21) Appl. No.: 10/536,654

(22) PCT Filed: Nov. 5, 2003

(86) PCT No.: PCT/EP03/12350

§ 371 (c)(1),
(2), (4) Date: Nov. 25, 2005

(87) PCT Pub. No.: WO2004/049619

PCT Pub. Date: Jun. 10, 2004

(65) Prior Publication Data

US 2006/0133553 A1 Jun. 22, 2006

(30) Foreign Application Priority Data

Nov. 27, 2002 (DE) .................... 102 55 355

(51) Int. Cl.
*H04L 7/00* (2006.01)
*G06F 1/04* (2006.01)

(52) U.S. Cl. .................. 713/500; 713/400; 713/501; 713/600; 710/61

(58) Field of Classification Search ............ 713/400, 713/500, 501, 502, 503, 600; 710/61
See application file for complete search history.

(56) References Cited

U.S. PATENT DOCUMENTS

| | | | | |
|---|---|---|---|---|
| 5,406,228 A | * | 4/1995 | Hoang ..................... 331/1 A |
| 5,459,855 A | * | 10/1995 | Lelm ......................... 713/400 |
| 5,511,100 A | * | 4/1996 | Lundberg et al. .......... 375/376 |
| 5,905,887 A | | 5/1999 | Wu et al. |
| 6,081,143 A | * | 6/2000 | Ho et al. .................... 327/166 |
| 6,121,816 A | | 9/2000 | Tonks et al. |
| 6,259,722 B1 | | 7/2001 | Dicker et al. |
| 6,294,962 B1 | * | 9/2001 | Mar ........................... 331/57 |
| 6,442,704 B1 | * | 8/2002 | Morimoto et al. ......... 713/500 |
| 2001/0016024 A1 | | 8/2001 | Treyer |
| 2006/0224910 A1 | * | 10/2006 | Li et al. ..................... 713/500 |

FOREIGN PATENT DOCUMENTS

| | | |
|---|---|---|
| DE | 199 31 244 A1 | 3/2000 |
| DE | 100 03 258 A1 | 8/2001 |
| EP | 0 645 689 A2 | 3/1995 |
| GB | 2 364 203 A | 1/2002 |

* cited by examiner

*Primary Examiner*—Mark Connolly
(74) *Attorney, Agent, or Firm*—Maginot, Moore & Beck

(57) ABSTRACT

The present invention provides a method for automatic identification of the clock frequency of a system clock (15) for the configuration of a peripheral device (12), having the following steps: generation of a secondary clock (16) at a predetermined clock frequency; application of the system clock (15) and of the secondary clock (16) to a host (10); application of the system clock (15) and of the secondary clock (16) to the peripheral device (12); determination of the clock frequency of the system clock (15) in the peripheral device (12) by means of the secondary clock (16); and configuration of the peripheral device (12) using the determined system clock (15).

16 Claims, 2 Drawing Sheets

PRIOR ART

METHOD FOR AUTOMATICALLY DETECTING THE CLOCK FREQUENCY OF A SYSTEM CLOCK PULSE FOR THE CONFIGURATION OF A PERIPHERAL DEVICE

FIELD OF THE INVENTION

The present invention relates to a method for automatic identification of the clock frequency of a system clock for the configuration of a peripheral device, and in particular to a method for automatic identification of the clock frequency of a system clock for the configuration of a mobile radio peripheral device.

BACKGROUND

In the course of the increasing integration of widely differing components in an appliance, it appears to be worthwhile to make use of the components which are already present in an appliance, and/or the resources of different components, that is to say more than once. Thus, for example, particularly in the mobile radio sector, it is possible to integrate a peripheral device, such as a Bluetooth module, in a GSM, CDMA cellular telephone, as a host device or host. The peripheral device or module should in this case use the same system clock, typically for example 10-100 MHz, as the main device or the host device.

FIG. 3 shows, schematically, a known arrangement for implementation of data interchange 14 between a first interface 11 of a host 10, and a second interface 13 of a peripheral module or of a peripheral device 12, as a function of a system clock 15. The main device 10 or the host and the peripheral module 12 in this case each interchange data 14 via an interface 11, 13. In order to allow the system costs to be reduced and in order to allow multiple use, both the host 10 and the module 12 are able to process and to cover a certain frequency range of system clocks 15 and their frequencies.

In order to make is possible to ensure this, it is necessary to configure both the host 10 and the peripheral module 12 to the system clock 15. One possible known arrangement is shown in FIG. 2, as an example of the peripheral module 12. The system clock 15 is supplied to the peripheral device 12 and is processed by a PLL (phase locked loop) 17, using a constant clock 18, which in turn is supplied to an interface 13 and/or to a processing device 19, for example a processor, a controller or a memory.

In order now, by way of example, to achieve a cost reduction for the overall system, the system is designed such that only the host 10 knows the precise system clock, and/or the host 10 can vary the clock during operation and must then signal this to the module 12. The module 12 therefore has no separate memory or the like containing any information about the system clock. The interface 13 of the module 12 must be configured to a specific transmission rate, typically, for example, 10 kbaud to 10 Mbaud, in which case this interface transmission rate must be within a specific tolerance band both for the main device 10 and for the peripheral module 12, with this tolerance band being defined, for example, by an interface standard. In this case, the actual transmission rate is dependent on the system clock 15, when the clock for supplying the individual internal components 13, 17, 19 of the peripheral device 12 is derived from the system clock 15 and, in consequence, in proportion to it.

In the known arrangement shown in FIG. 3, the information about the system clock 15 can be signaled to the module 12 in such a way that, in the initialization phase, all of the internal components 13, 17, 19 of the module 12 are supplied with the system clock 15 or with predetermined clock ratios of this clock. This precondition must be ensured by the module 12 both in terms of hardware and software in a predetermined minimum/maximum range of the system clock 15. The transmission rate of the interface 13 is then chosen as a fixed ratio to the system clock 15, thus ensuring that the main device 10 and the peripheral device 12 have the same transmission rate at the interfaces 11, 13, and can thus communicate with one another. The information about the system clock, and likewise about the desired transmission rate for the interfaces 11, 13, is then signaled to the module 12 via this interface 13. The host 10 can then switch the interface transmission rate once the module has been configured to the known system clock 15 and the interface transmission rate has been set.

Complex configuration of the peripheral module to the system clock must therefore be carried out. Furthermore, the known system implementation is based on the principle that the transmission rate of the interface must be set as a fixed ratio to the system clock in the initialization phase, in order that the host and the module provide the same transmission rate at their interfaces.

SUMMARY

The object of the present invention is thus to provide a method for automatic identification of the clock frequency of a system clock for the configuration of a peripheral device, by means of which the process of configuration of the peripheral device is simplified.

According to the invention, this object is achieved by the method for automatic identification of the clock frequency of a system clock for the configuration of a peripheral device.

The idea on which the present invention is based is essentially to provide both the main device and the peripheral device with a further clock signal at a precisely known clock frequency, which further clock signal is used, for example, for low-power modes, such as a 32.768 kHz clock signal.

In the present invention, the problem mentioned initially is solved in particular by providing a method for automatic identification of the clock frequency of a system clock for the configuration of a peripheral device having the following steps: generation of a secondary clock at a predetermined clock frequency; application of the system clock and of a secondary clock to a host; application of the system clock and of the secondary clock to the peripheral device; determination of the clock frequency of the system clock in the peripheral device by means of the secondary clock; and configuration of the peripheral device using the determined system clock.

Advantageous developments and improvements of the subject matter of the invention can be found in the dependent claims.

According to one preferred development, the system clock is determined by counting a number of edge changes of the system clock within a predetermined number of periods of the secondary clock.

According to a further preferred development, during the configuration of the peripheral device, the identical interface transmission rate is set for the first and second interface as a function of the determined system clock.

According to a further preferred development, the interface transmission rate is set to an interface transmission rate which is defined by the standard of the interfaces.

According to a further preferred development, after an initialization phase, the system clock can be changed by the main device with a system clock (which is then new) of the peripheral device being signaled exactly via the interfaces.

According to a further preferred development, tolerances of both the system clock and of the secondary clock are taken into account in the determination of the system clock by the peripheral device.

According to a further preferred development, the transmission rate of the data transmission between the first interface and the second interface is dependent on the system clock.

According to a further preferred development, the clock frequency of the system clock is variable at predetermined clock frequencies and is determined by the main device after an initialization phase.

According to a further preferred development, the clock frequency of the system clock, which is determined automatically by the peripheral device, has discrete clock frequencies which are compared in the peripheral device with discrete clock frequencies that are stored in a table, in order to use the tabular value of the clock frequency as the current clock frequency of the system clock.

According to a further preferred development, a PLL circuit in the peripheral device generates a constant clock frequency from the system clock frequency, which clock frequency is supplied to the second interface and/or to a processing device, such as a processor, controller or memory.

One exemplary embodiment of the invention is illustrated in the drawings and will be explained in more detail in the following description.

DETAILED DESCRIPTION

Identical reference symbols in the figures denote identical or functionally identical components.

Figure 1:
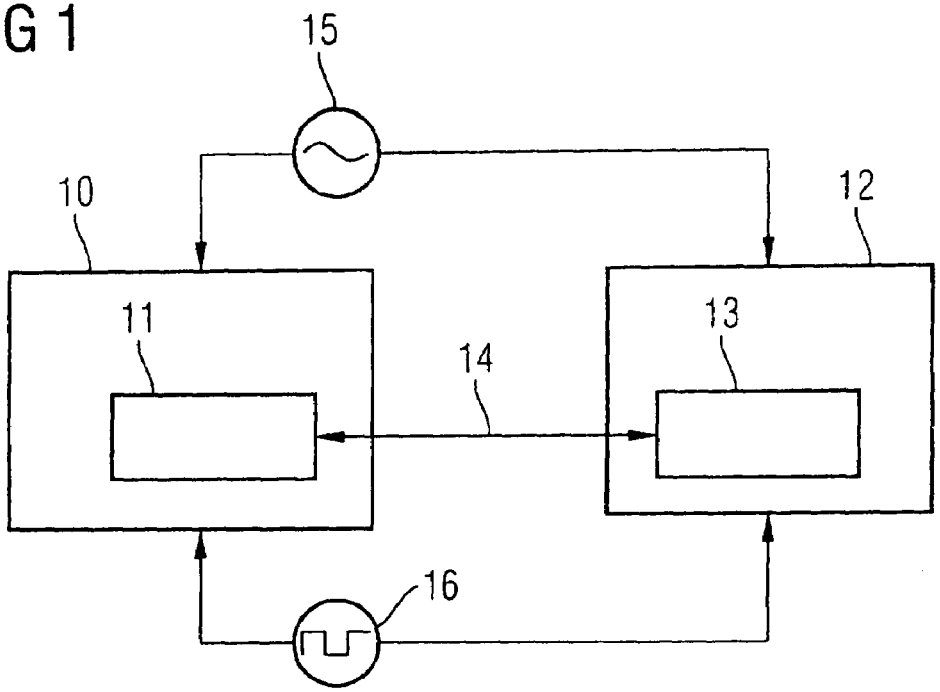
FIG. 1 shows a schematic block diagram in order to explain one embodiment of the present invention.
Figure 2:
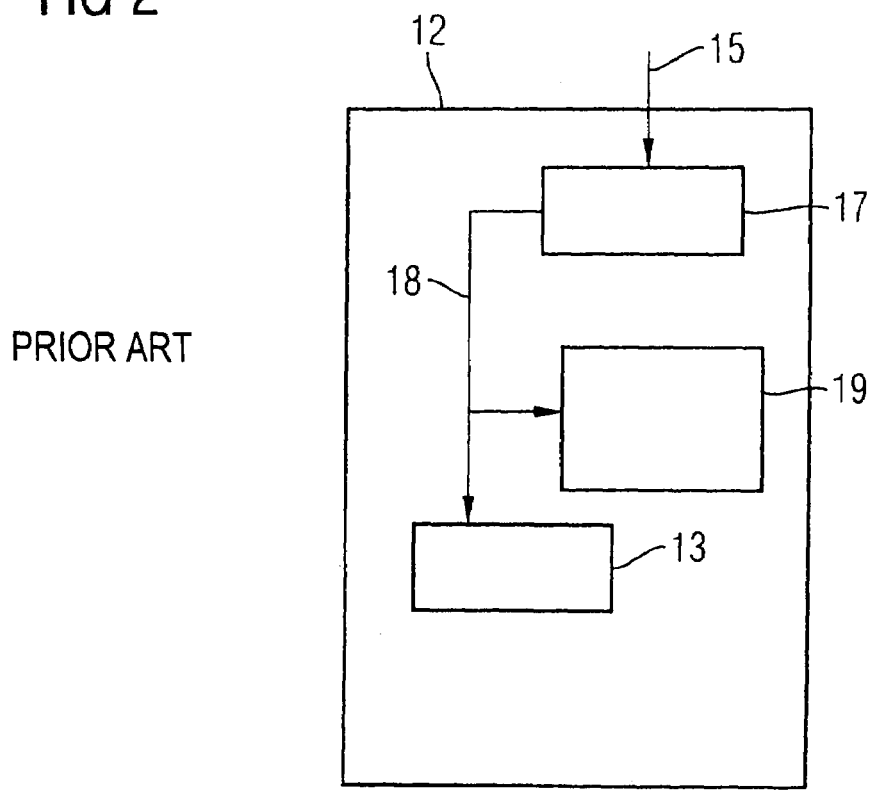
FIG. 2 shows a schematic block diagram of one known peripheral device.
Figure 3:
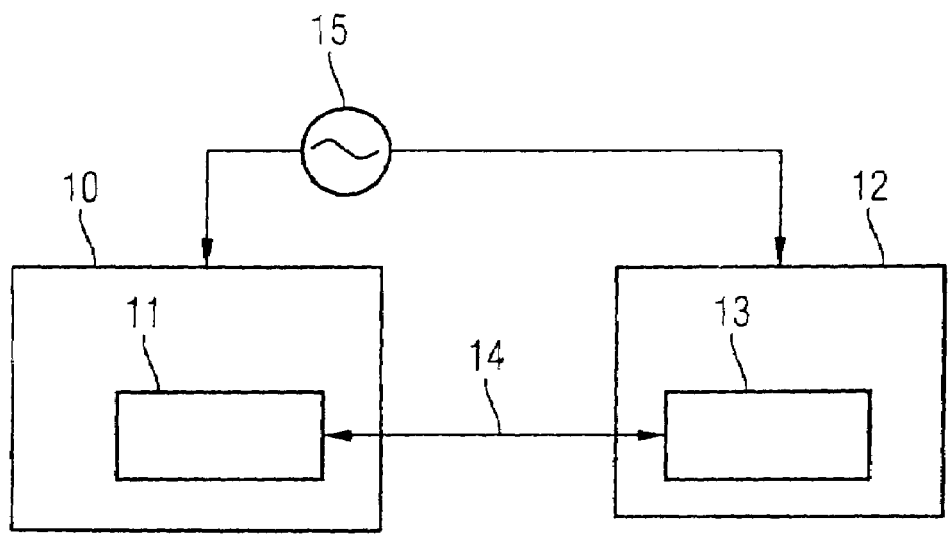
FIG. 3 shows a schematic block diagram of a conventional arrangement.

FIG. 1 shows an arrangement for automatic determination of the clock frequency of a system clock according to one embodiment of the present invention. The arrangement shown in FIG. 1 has a main device 10 or a host, which has a first interface 11. A peripheral device 12 is also provided, and likewise has an interface 13. The aim is for data interchange 14 to be possible between the first interface 11 of the main device 10 and the second interface 13 of the peripheral device or of the peripheral module. Both the host device 10 and the peripheral module 12 are supplied with a system clock 15. Furthermore, both the peripheral module 12 and the host device 10 are supplied with a secondary clock signal 16. The peripheral module 12 preferably has a structure as described with reference to FIG. 2.

First of all, a secondary clock 16 is produced at a specific known clock frequency, for example a crystal clock frequency. The peripheral device 12 or the module can then use its knowledge of the clock frequency of the secondary clock 16 to itself determine the clock frequency of the system clock 15 that is likewise present, for example by measuring, that is to say in particular by counting, the number of edge changes or rising or falling edges of the system clock 15 within one or more periods of the secondary clock 16, or of the low-power clock. The tolerances of both the clock frequency of the system clock 15 and the clock frequency of the secondary clock 16 must be taken into account in this case, and their influence on the determined clock frequency of the system clock 15 may be minimized, for example by a number of measurements.

If mapping onto exact system clock frequencies is not intended, then the clock frequency of the system clock as determined automatically by the peripheral device 12, including any possible error resulting from possible tolerances of the system clock 15 and of the secondary clock 16 that are supplied may be used. This automatically determined clock frequency of the system clock is then used to set the interface 13 in the peripheral device 12 to an interface transmission rate as defined by the interface standard, for example RS232. Since the tolerances in the interface transmission rate as accepted by the first and second interfaces 11, 13 of the main and peripheral devices 10, 12 are in general considerably wider than the tolerances which can be expected in the system clock 15 and in the secondary clock 16, communication can nevertheless take place between the host 10 and the module 12. Subsequently, the main device 10 can then signal to the peripheral module 12 the exact system clock via the data interchange 14 which is carried out via the interfaces 11, 13.

Since, in general, the system clock 15 does not have undefined clock rates or frequency values, but, in general, only predetermined discrete clock rates or possible frequency values occur, these may be stored, for example, in a table in the peripheral device 12, and are then compared with the clock frequency of the clock signal 15 as determined automatically by the peripheral device 12. The closest tabular value to a clock frequency of the system clock rate in the peripheral device 12 can then be used on the basis of this comparison, thus allowing an association with an exact clock frequency of the system clock even in the event of possible tolerances of the clock frequency of the system clock 15 and/or of the secondary clock 16.

In consequence, with the method according to the invention, there is no need to carry out a basic configuration of the module for the clock frequency of the system clock 15 but the setting of a different interface transmission rate to the preset interface transmission rate between the interfaces 11 and 13 of the host 10 and of the peripheral device 12, respectively, remains, with this setting in general being standardized. Furthermore, with the described method, it is not essential for the transmission rate of the interface to be set in an initialization phase as a fixed ratio to the clock frequency of the system clock, but, according to the invention, once the clock frequency of the system clock 15 has been determined automatically, data interchange 14 can take place at an interface transmission rate as defined by the interface standard, thus allowing communication between the host 10 and the peripheral device 12.

Although the present invention has been described above with reference to a mobile radio device, it is not restricted to this but, in principle, can be extended to any desired system with a host and a peripheral device between which communication is intended to take place. Furthermore, the method for determination of the system clock can be seen, by way of example, in the counting of the edge changes, rising edges or falling edges of the system clock within one or more periods of the secondary clock, and may also be carried out in a different manner. In particular, the peripheral device (12) may, for example, be a Bluetooth module and may be configured for the system clock of a mobile radio device, for example a cellular telephone.

LIST OF REFERENCE SYMBOLS

10 Main device, host
11 Interface of the main device (data interchange)
12 Peripheral device, peripheral module
13 Interface of the peripheral device
14 Data interchange
15 System clock
16 Secondary clock, for example a low-power clock; 32.768 kHz clock
17 PLL (phase locked loop)
18 Constant clock
19 Processing devices, for example processor, controller, memory

The invention claimed is:

1. A method of identifying a clock frequency of a system clock for the configuration of a peripheral device, the method comprising:
   a) providing a secondary clock at a predetermined clock frequency;
   b) applying the system clock and the secondary clock to a host;
   c) applying the system clock and the secondary clock to the peripheral device;
   d) determining the clock frequency of the system clock in the peripheral device using the second clock and based on the predetermined clock frequency; and
   e) configuring the peripheral device using the determined system clock;
   wherein the clock frequency of the system clock is variable at predetermined clock frequencies and further comprising a step of employing the host to determine the clock frequency after an initialization phase; and
   wherein step d) further comprises determining the clock frequency with a tolerance in the peripheral device, and then comparing, in the peripheral device, the determined clock frequency with the tolerance to a table of possible frequency values and selecting in the peripheral device the clock frequency of the system clock based on the comparison.

2. The method as claimed in claim 1, wherein step d) further comprises counting a number of edge changes of the system clock within a predetermined number of periods of the secondary clock.

3. The method as claimed in claim 2, wherein step e) further comprises setting an identical interface transmission rate for a first interface of the host and for a second interface of the peripheral device as a function of the clock frequency of the determined system clock.

4. The method as claimed in claim 3, wherein step e) further comprises setting the interface transmission rate to an interface transmission rate defined by a predetermined standard.

5. The method as claimed in claim 3, wherein further comprising:
   after an initialization phase, employing the host to change the system clock; and
   signaling information representative of the change to the peripheral device through the second interface.

6. The method as claimed in claim 1, wherein step d) further comprises employing tolerances of both the system clock and the second clock to determine the clock frequency of the system clock in the peripheral device.

7. The method as claimed in claim 1, wherein a transmission rate of data transmission between a first interface of the host and a second interface of the peripheral device is dependent on the clock frequency of the system clock.

8. The method as claimed in claim 1, further comprising employing a PLL circuit in the peripheral device to generate a constant clock frequency from the clock frequency of the system clock.

9. The method as claimed in one of the preceding claims, further comprising providing a Bluetooth module as the peripheral device, the Bluetooth module configured for the system clock of a mobile radio device.

10. A method of identifying a clock frequency of a system clock for the configuration of a peripheral device, the method comprising:
    a) providing a secondary clock at a predetermined clock frequency;
    b) applying the system clock and the secondary clock to a host;
    c) applying the system clock and the secondary clock to the peripheral device;
    d) determining the clock frequency of the system clock in the peripheral device using the second clock based on the predetermined clock frequency; and
    e) setting an identical interface transmission rate for a first interface of the host and for a second interface of the peripheral device as a function of the clock frequency of the determined system clock;
    wherein step d) further comprises determining the clock frequency with a tolerance in the peripheral device, and then comparing, in the peripheral device, the determined clock frequency with the tolerance to a table of possible frequency values and selecting in the peripheral device the clock frequency of the system clock based on the comparison.

11. The method as claimed in claim 10, wherein step d) further comprises counting a number of edge changes of the system clock within a predetermined number of periods of the secondary clock.

12. The method as claimed in claim 11, wherein step e) further comprises setting the interface transmission rate to an interface transmission rate defined by a predetermined standard.

13. The method as claimed in claim 11, wherein further comprising:
    after an initialization phase, employing the host to change the system clock; and
    signaling information representative of the change to the peripheral device through the second interface.

14. The method as claimed in claim 10, wherein step d) further comprises employing tolerances of both the system clock and the second clock to determine the clock frequency of the system clock in the peripheral device.

15. The method as claimed in claim 10, wherein a transmission rate of data transmission between a first interface of the host and a second interface of the peripheral device is dependent on the clock frequency of the system clock.

16. The method as claimed in claim 10, wherein the clock frequency of the system clock is variable at predetermined clock frequencies and further comprising a step of employing the host to determine the clock frequency after an initialization phase.

* * * * *